United States Patent [19]

Jannssen et al.

[11] 3,811,893

[45] May 21, 1974

[54] PHOTOMASK

[75] Inventors: Casper Johannes Gerardus Ferdinand Jannssen, Emmasingel, Eindhoven; Hendirk Jonker, Eindhoven; Pieter Willem Haaijman, Emmasingel, Eindhoven; Lambertus Postma, Emmasingel, Eindhoven; Jacob Klass Vondeling, Emmasingel, Eindhoven, all of Netherlands

[73] Assignee: U.S. Philips Corporation, New York, N.Y.

[22] Filed: Jan. 2, 1973

[21] Appl. No.: 319,986

[30] Foreign Application Priority Data

Jan. 8, 1972 Netherlands ........................ 7200295

[52] U.S. Cl. .................. 95/1 R, 96/36.2, 96/48 PD, 355/125

[51] Int. Cl. ........................................................ G03b

[58] Field of Search ........... 95/1 R; 96/38.3, 48 PD, 96/36.2; 355/125, 133

[56] References Cited

UNITED STATES PATENTS 3,409,429 11/1968 Ekman et al. ..................... 95/1 R X

OTHER PUBLICATIONS

H. Jonker et al., "Principles of PD Recording Systems and Their Use in Photofabrication", Journal of Photographic Science, Vol. 19, 1971, p. 101.

*Primary Examiner*—Samuel S. Matthews
*Assistant Examiner*—Kenneth C. Hutchison
*Attorney, Agent, or Firm*—Norman N. Spain; Frank R. Trifari

[57] ABSTRACT

A photomask on a transparent, dimensionally stable substrate whose pattern consists of a phosphorus-containing or boron-containing nickel which is adhered to the substrate through a metal nuclei image which in turn overlies a transparent film of a photosensitive semiconducting oxide. To increase wear resistance and reduce reflection a top layer of transparent semi-conducting oxide may be provided.

2 Claims, No Drawings

PHOTOMASK

The invention relates to a photomask and to methods of manufacturing said mask.

In the electronics industry photomasks are often used for the manufacture of miniaturized circuits such as integrated circuits on semiconductor substrates, hybrid circuits of this kind, thin-film circuits etc. These photomasks are generally obtained by optical diminution of a design drawn mutually or mechanically. In bulk manufacture they must be multiplied many times. They must be very wear-resistant and scratch-resistant.

Wear-resistant photomasks have hitherto been formed in chromium on a glass substrate. This is an eminent construction but it is rather costly because chromium masks must be manufactured in an intricate and time-consumimg manner.

According to a known method of manufacturing wear-resistant photomasks by means of copying, starting from a slightly wear-resistant master mask, a photoresist is provided on a transparent support which is coated with a thin chromium film. The photoresist is exposed in contact with the master mask, the photoresist is developed, chromium on the exposed areas is removed by means of a chemical etchant and finally the resist still present is removed. The chromium film is provided by vapour deposition in vacuo. In addition to the high cost, a further drawback of this type of photomask is that the patterns have underetched edges.

The invention provides a photomask which is very wear-resistant and is much cheaper than the chromium masks used up till now. In addition the edges of the patterns are not underetched.

According to the invention the photomask on a transparent, dimensionally stable substrate is characterized in that one side of the substrate is coated over its entire surface with a transparent film of a photosensitive semiconducting oxide and that a phosphorus-containing or boron-containing nickel film having a thickness of not less than 0.1 $\mu$m and not more than 1.0 $\mu$m is provided thereon in accordance with the desired mask pattern through an intermediate layer consisting of metal nuclei.

These photomasks may be manufactured in accordance with some simple alternative methods.

Photosensitive material consisting of a substrate, inter alia, glass, provided with a transparent film of titanium dioxide is known from U.S. Pat. No. 3,409,429, while photosensitive material based on a semiconducting oxide on aluminium is known from United Kingdom patent specification No. 1,138,858. This material is exposed and is brought into contact with a liquid redox system so that an irreversible image corresponding to the exposure pattern is formed. The material is intended for purely photographical uses, that is to say, the reproduction of information in the form of photographic images. For this purpose silver is mainly used as an image metal.

The Applicant has found that only phosphorus-containing or boron-containing nickel as obtained by chemical reduction of a nickel-salt solution with the aid of a soluble hypophosphite or a soluble reducing boron compound is suitable as a wear-resistant film and that in addition the film thickness must be at least 0.1 $\mu$m.

As described above, the photomask according to the invention may be manufactured in accordance with different methods, starting from material having a transparent film of a photosensitive semiconducting oxide on a transparent dimensionally stable support. This material may be obtained by spraying a solution of an organic titanium compound, a solution of an inorganic titanium compound or such a compound of Sn, Zn or Zr on the substrate heated to a temperature of, for example, 500°C. Examples are tetraalkyl esters such as tetrabutyl titanate, titanium acetyl acetonate, tin tetrachloride, diphenyl zinc, zirconium acetate, etc.

When using these methods it is, however, necessary to take steps which prevent metal from being deposited outside the image pattern in the form of fog.

According to a suitable method a photomask according to the invention is manufactured by providing a transparent film of a photosensitive semiconducting oxide on a substrate consisting of glass by contacting the glass at an elevated temperature with organic or inorganic compound of the relevant metal so that pyrolysis occurs, by providing a photoresist on the film thus obtained and by exposing in such a manner that after development the negative of the desired mask pattern is coated, by subsequently rinsing with a concentrated oxidizing acid and by subsequently performing in an arbitrary sequence one of the two treatments consisting of uniform exposure and contacting with a solution of ions of copper and/or a metal which is nobler than copper, by rinsing the assembly with a solution of an alkyl aryl sulphonate or an aryl sulphonate, by intensifying the film provided with nuclei by exposure with the aid of a solution comprising a nickel salt and a soluble hypophosphite or a soluble boron compound as a reduction agent and by finally removing the photoresist left.

Another preferred method of manufacturing a photomask according to the invention consists in that a transparent film of a photosensitive semiconducting oxide is provided on a substrate likewise consisting of glass and that subsequently one of the two treatments consisting of exposure behind a negative of the desired mask pattern and contacting with a solution of ions of copper and/or a metal which is nobler than copper is performed in an arbitrary sequence, that subsequently the assembly is treated with a solution comprising a compound chosen from the classes of compounds of alkyl aryl sulphonates, aryl sulphonates and organic compounds with OH, Cl and/or $NH_2$ groups which comprise at least two of these groups per compound or salts of these compounds and in which these groups are each separated by two or three carbon atoms, and that finally the film provided with nuclei by exposure is intensified with the aid of a solution comprising a nickel salt and a soluble hypophosphite or a soluble boron compound as a reduction agent.

Treatment of the substrate provided with nuclei with the aid of the above-described solution has for its object to remove the ions which have not been reduced to metal. The said classes of compounds comprise the only compounds with which this can be effected and can thus prevent the occurrence of metal deposition outside the desired mask pattern.

Examples of alkyl aryl sulphonates are the following, which are commercially available as surface-active compounds under the trade name referred to. Dependent on the compound chosen a solution of 0.1 to 10 percent by weight in water is used.

Tensagex, an Na salt of a polyoxyethylene benzene sulphonic acid with approximately 4 oxyethylene groups (1 to 4 percent). Igepal CM, an Na salt of a polyoxyethylene benzene sulphonic acid with approximately 12 oxyethylene groups (4 to 10 percent). Nekal BX (0.1–1 percent), Aresket 300 (5 percent), Areskap 100 (5 percent) and Aresklene 400 (1 to 5 percent) all of which are sulphonates of butylated diphenyl.

Examples of the said organic compounds with OH, Cl and/or $NH_2$ groups are, inter alia, the Na salt of monochloric acetic acid, K-oxalate, Na-glycolate, animoacetic acid, propylene glycol, dipropylene glycol, 1,4-dihydroxy-anthraquinone and pyrocatechol.

It has been found to be advantageous to perform the exposure of the semiconducting oxide in the abovementioned methods at a temperature of between approximately 40° and 50°C. This has a favourable effect with respect to the evenness of thickness of the nickel patterns in the final product.

According to a further preferred embodiment of the two described methods the photomask obtained is subjected to a thermal post-treatment at a temperature of between approximately 200° and 285°C. This thermal treatment which may be performed both in vacuo and in nitrogen or air results in a further increase of the wear resistance.

Finally a preferred embodiment of the photomask according to the invention is provided with a second film of a transparent semiconducting oxide on the phosphorus or boron-containing nickel layer, which results in a reduction of the reflection and an increase of the wear resistance.

The invention will now be further described with reference to a number of examples.

EXAMPLE I

Plates having a surface of 5 × 5 sq. cm, consisting of glass of the nominal composition in percent by weight: $SiO_2$ 80, $B_2O_3$ 13; $Na_2O$ 4; $K_2O$ 1 and $Al_2O_3$ 2 are ultrasonically cleaned in a solution to which per litre of concentrated sulphuric acid 35 mls of a saturated sodium bichromate solution in water have been added, rinsed in filtered and deionized water and degreased in isopropanol vapour. A 20 percent solution of titanium acetyl acetonate in diacetone alcohol is provided on the plates in a quantity of 0.5 ml per plate by means of a syringe provided with a filter having a pore size of 0.25 $\mu$m. This solution is evenly spread over the surface by a 1 minute centrifuging operation at a rate of 1,500 r.p.m. The plates are heated for 5 minutes at a temperature of 500°C while pyrolysis of the titanium acetyl acetonate is effected. An approximately 50 nm thick transparent $TiO_2$ film is formed. Also with the aid of a syringe provided with a filter having a pore size of 0.25 $\mu$m this $TiO_2$ film is provided with a positive photoresist based on a carboxymethyl ether of a formaldehyde resin comprising o-quinonediazide as a sensitizer and being commercially available under the name AZ 1350 from the firm of Shipley, and diluted in an equal volume quantity with an organic ester available from the same firm under the name of AZ Thinner. The solution is evenly distributed over the surface by centrifuging for 1 minute at a rate of 3,000 r.p.m. The plates are subsequently dried for 12 minutes at 66°C. The thickness of the photosensitive film is 0.2 $\mu$m.

The plates are exposed in a cassette behind a negative for 14 seconds at a distance of 30 cms from a 125 Watt HPR lamp while the negative is held against the plates with the aid of compressed air. Subsequently the plates are developed for 2 minutes in an aqueous alkaline solution which is available under the name of AZ Developer from the firm of Shipley and is diluted with equal parts by volume of water.

After development the plates are successively rinsed in deionized water, immersed for 1 minute in 60 percent $HNO_3$ and rinsed with filtered, deionized water.

The plates are immersed in and subsequently drawn out of a solution in water which contains per litre 1 g $PdCl_2$, 10 ml concentrated HCl (d = 1.19) and 4 g of an alkyl aryl sulphonate marketed under the name of Tensagex BP24. Subsequently the plates are uniformly exposed for 3 minutes by means of an HPR lamp of 125 Watts placed at a distance of 30 cms at a temperature of the plates of 46°C. Pd nuclei are formed only at the areas where the Pd compound is in contact with the $TiO_2$ film. The non-reduced $PdCl_2$ is removed by rinsing the plates in a 1 percent solution of Tensagex BP24 in water.

The nuclear image on the plates is subsequently intensified to a phosphorus-containing nickel film having a thickness of 0.3 $\mu$m by keeping the plates immersed for 3 minutes in a bath heated to 94°C and containing per litre:

30 g $NiCl_2 \cdot 6H_2O$ 30 g $H_2NCH_2COOH$ and 10 g $NaH_2PO_2 \cdot H_2O$

The photoresist left is subsequently removed with the aid of Shipley's AZ Remover.

To improve the wear resistance of the film a transparent $TiO_2$ film is provided thereon with the aid of a solution of titanium acetyl acetonate as described above and the plates are heated to 240°C.

NiP patterns on glass with details of 0.8 $\mu$m are obtained in the manner described while the wear resistance of the photomasks thus obtained is at least equal to the wear resistance of commercially available chromium masks.

Similar results are obtained with the aid of a different positively acting photoresist, for example, PR 102 of GAF or with a negatively acting photoresist, for example, KTFR of Kodak, which consists of polyvinyl cinnamate.

$PdCl_2$ may be replaced in the nucleating solution by $PtCl_2$ with the same results.

EXAMPLE II

A number of glass plates is provided in the same manner as in the example described hereinbefore with a nuclear image in accordance with the desired mask pattern with the aid of a photoresist. The nuclear image obtained is, however, intensified for 6 minutes in air in a bath heated to 70°C containing per litre 30 g $NiSO_4 \cdot 7H_2O$ 18 g aminoacetic acid 27 g malonic acid 3.5 g dimethylamineborane, whose pH is adjusted with ammonia at 7.

As in the foregoing example the nickel pattern is provided with a wear-resistant transparent $TiO_2$ film.

EXAMPLE III

A number of glass plates is coated in the same manner as in Example I with a transparent $TiO_2$ film. The plates are immersed in a solution which contains per litre 1 g $PdCl_2$, 10 ml concentrated HCl and 4 g Tensagex BP24 and the plates are drawn out of this solution. The plates thus coated with a $PdCl_2$ film are exposed behind a negative for 30 seconds at a distance of 30 cms from a HPR lamp of 125 Watts. A palladium nuclear image is produced at the exposed areas. The $PdCl_2$ present at the nonexposed areas is removed by rinsing the plates for 1 minute in a solution of 20 g Tensagex BP24 per litre of water.

The nuclear image is subsequently intensified to a nickel image for 3 minutes with the aid of the bath heated to 94°C which bath is described in Example I and, in the same manner as in said example, the plates are coated with a transparent $TiO_2$ film.

EXAMPLE IV

In the same manner as in example III glass plates coated with a transparent $TiO_2$ film were provided with a Pd nuclear image by heating with a $PdCl_2$ containing solution and by subsequent exposure. The $PdCl_2$ present at the non-exposed areas is removed by rinsing for 1 minute in a solution of 75 g aminoacetic acid per litre of water.

Intensification of the nuclear image to a nickel pattern and coated of this pattern with a wear-resistant transparent $TiO_2$ film is effected in the manner as described in Example III.

What is claimed is:

1. A photomask on a transparent, dimensionally stable substrate comprising a transparent film of a photosensitive semi-conducting oxide coating an entire surface of said substrate, an intermediate layer consisting of metal nucleii on said transparent film and a nickel film consisting of a member selected from the group consisting of phosphorus-containing nickel and boron-containing nickel on said intermediate layer, the configuration of said nickel film corresponding to a desired mask pattern and said nickel film being not less than 0.1 $\mu$m and not more than 1.0 $\mu$m thick.

2. The photomask of claim 1 wherein a second film of a transparent semiconducting oxide is located on said nickel film.

* * * * *

PO-1050
(5/69)

UNITED STATES PATENT OFFICE
CERTIFICATE OF CORRECTION

Patent No. 3,811,893 Dated May 21, 1974

Inventor(s) CASPER JOHANNES GERARDUS FERDINAND JANSSEN ET AL

It is certified that error appears in the above-identified patent and that said Letters Patent are hereby corrected as shown below:

In the title page, Item [75] "Jannssen" should be -- Janssen --.

Signed and sealed this 24th day of September 1974.

(SEAL)
Attest:

McCOY M. GIBSON JR.
Attesting Officer

C. MARSHALL DANN
Commissioner of Patents